(12) United States Patent
Slamani et al.

(10) Patent No.: US 10,949,005 B2
(45) Date of Patent: Mar. 16, 2021

(54) ABSOLUTE PHASE MEASUREMENT TESTING DEVICE AND TECHNIQUE

(71) Applicant: GLOBALFOUNDRIES U.S. INC., Santa Clara, CA (US)

(72) Inventors: Mustapha Slamani, South Burlington, VT (US); Kaushal Kannan, Essex Junction, VT (US); Ritin Nambiar, South Burlington, VT (US); Timothy M. Platt, Williston, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/429,702

(22) Filed: Jun. 3, 2019

(65) Prior Publication Data
US 2020/0379585 A1 Dec. 3, 2020

(51) Int. Cl.
  *H04B 3/46* (2015.01)
  *G06F 3/041* (2006.01)
  *H04L 7/02* (2006.01)
  *G06F 3/0484* (2013.01)

(52) U.S. Cl.
  CPC ............ *G06F 3/041* (2013.01); *G06F 3/0484* (2013.01); *H04L 7/02* (2013.01)

(58) Field of Classification Search
  CPC ........... G06F 3/041; G06F 3/0484; H04L 7/02
  See application file for complete search history.

(56) References Cited

U.S. PATENT DOCUMENTS

| | | | |
|---|---|---|---|
| 5,294,934 A | | 3/1994 | Matsumoto |
| 5,524,281 A | * | 6/1996 | Bradley ................. G01R 27/28 324/601 |
| 10,181,915 B1 | | 1/2019 | Slamani et al. |
| 2015/0198523 A1 | * | 7/2015 | Dunsmore ............. G01R 27/32 356/446 |
| 2016/0204881 A1 | * | 7/2016 | Chung ................... H04B 17/00 455/67.14 |
| 2016/0336989 A1 | * | 11/2016 | Lin ...................... H04L 27/3881 |

FOREIGN PATENT DOCUMENTS

JP          2005308511          11/2005

OTHER PUBLICATIONS

Unknown, "De-Embedding and Embedding S-parameter Networks Using a Vector Network Analyzer", Application Note, Keysight Technologies, www.keysight.com/find/na, Sep. 7, 2017, 25 pages.

* cited by examiner

*Primary Examiner* — Dhaval V Patel
(74) *Attorney, Agent, or Firm* — Anthony Canale; Andrew M. Calderon; Roberts Calderon Safran & Cole, P.C.

(57) ABSTRACT

The present disclosure relates to a testing device and techniques of testing semiconductor structures and, more particularly, to an absolute phase measurement testing device and technique of testing semiconductor structures. The structure includes: a first frequency input source which provides a first signal to an up-converter at an input side of a test fixture; a down-converter on an output side of the test fixture; a second frequency signal source which provides a second signal at a higher frequency than the first signal to the up-converter and the down-converter on the output side of the test fixture; a bypass path which bypasses the test fixture and provides connection between the up-converter and the down-converter; and a digitizer that is connected to an output side of the down-converter.

17 Claims, 4 Drawing Sheets

ABSOLUTE PHASE MEASUREMENT TESTING DEVICE AND TECHNIQUE

FIELD OF THE INVENTION

The present disclosure relates to a testing device and techniques of testing semiconductor structures and, more particularly, to an absolute phase measurement testing device and technique of testing semiconductor structures.

BACKGROUND

Complementary metal oxide semiconductor (CMOS) transistor devices and bipolar transistors are commonly used in microwave and radio frequency transmitter and receiver devices (e.g., "RF devices"). Such RF devices need to be thoroughly characterized and tested, which can be challenging because these RF devices can be designed to perform with millimeter wavelengths operating at very high frequencies (e.g., 1 GHz-100 GHz).

Commonly, such RF devices have the ability to operate at different frequency bands, and through different ports, in order to increase the transmission bandwidth. The testing equipment therefore must be able to test the phase difference information between the different ports of the receiver/transmitter at multiple frequencies. Such requirements make testing equipment for such sophisticated RF devices large, slow, and very expensive. Additionally, such test devices can lack accuracy because they can suffer from undesirable noise or other interference.

Further, the RF device can have a variable phase adjustment circuit that is highly sensitive to fabrication processes, requiring that every produced device be tested. However, no millimeter wave production automatic test equipment (ATE) offers a phase measurement capability. While some bench equipment can measure phase, such are not adequate to support high volume testing of every device produced due to the size, cost, and slow speed of such bench equipment.

SUMMARY

In an aspect of the disclosure, a structure comprises: a first frequency input source which provides a first signal to an up-converter at an input side of a test fixture; a down-converter on an output side of the test fixture; a second frequency signal source which is split to provide a second signal at a higher frequency than the first signal to the up-converter and the down-converter; a bypass path which bypasses the test fixture and provides connection between the up-converter and the down-converter; and a digitizer that is connected to an output side of the down-converter.

In an aspect of the disclosure, a structure comprises: an intermediate frequency (IF) source; an RF frequency source; a first mixer at an input of a device under test and which up-converts a signal from the IF frequency source; a second mixer at an output of the device under test and which down-converts a signal received from the device under test or the up-converted signal; a bypass path which bypasses the device under test and provides connection between the first mixer and the second mixer; and a splitter which splits a signal from the RF source to the first mixer and second mixer.

In an aspect of the disclosure, a method comprises: up-converting a source signal using a first signal; bypassing a device under test with the up-converted source signal; down-converting the source signal using the first signal; providing the up-converted source signal to the device under test; down-converting a signal received from the device under test; determining an absolute phase of the device under test by subtracting the down-converted signal of the device under test from the down-converted signal of the bypassing.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
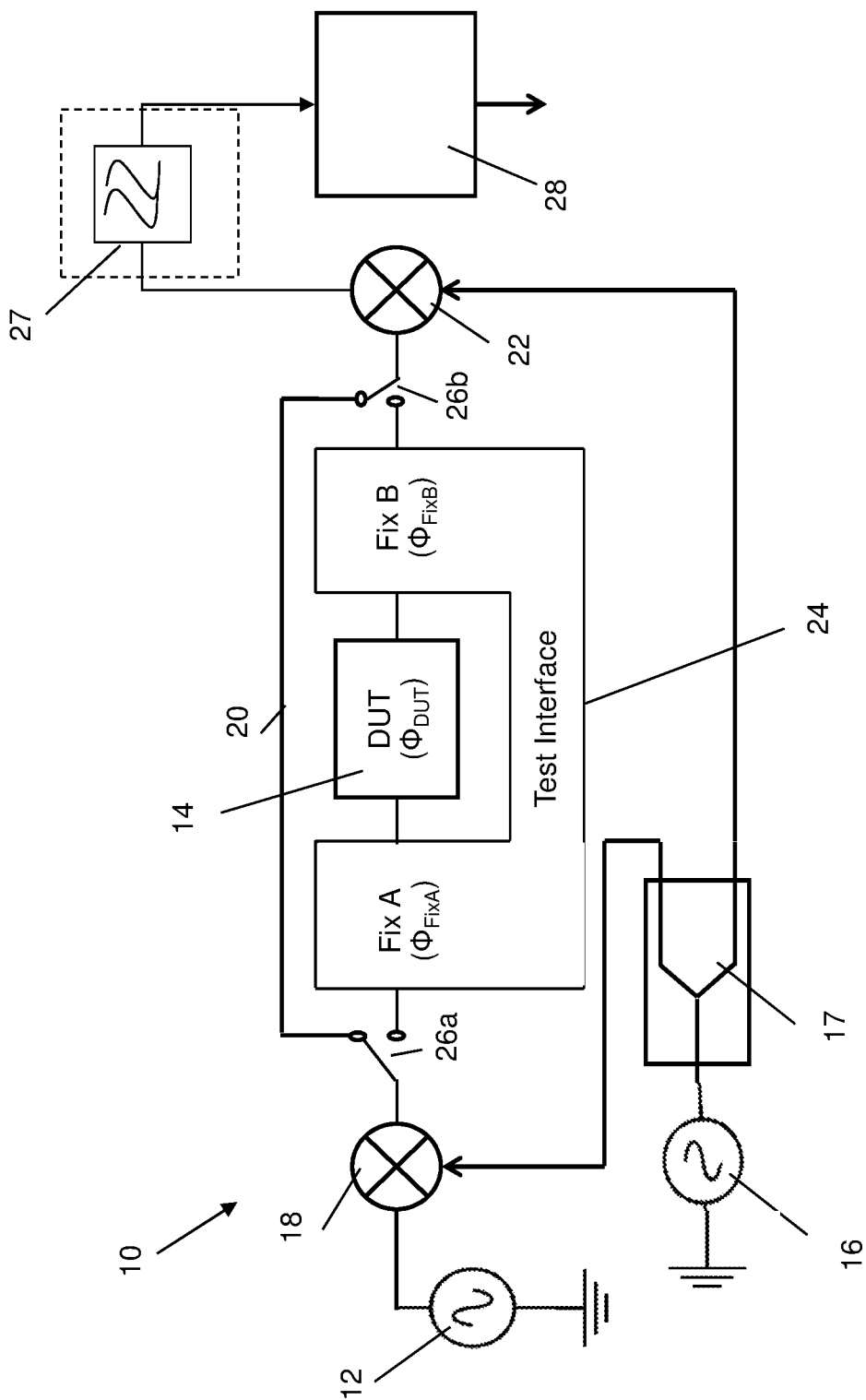
FIG. 1 shows a testing (measurement) device in a bypass mode in accordance with aspects of the present disclosure.

The present disclosure relates to testing equipment and techniques of testing semiconductor structures and, more particularly, to an absolute phase measurement testing device (equipment) and techniques of testing semiconductor structures. More specifically, the present disclosure provides testing equipment and a technique of measuring an absolute phase of phased array RF devices using Fast Fourier Transform (FFT). Advantageously, the present disclosure provides measurement of absolute phase of RF devices using the phase difference measured between an input signal and an output signal without the need for expensive test setup employing bi-directional couplers at both the input at output sides.

In embodiments, the testing equipment is an alternative to current Programmable Network Analyzer (PNA) equipment. The testing equipment is very fast to test and provides a small footprint compared to conventional testing equipment. For example, the test technique provides streamlined testing processes, not requiring conversion from S-parameters to T-parameters (scattering transfer parameters). In other words, by implementing the test equipment and techniques described herein, it is no longer necessary to convert measured S-parameters into T-parameters to de-embed fixtures and re-convert the T-parameters to S-parameters to obtain the absolute phase of the device under test (DUT). Moreover, the testing equipment can be implemented in current production environments, with minimal updates to existing setup equipment.

High frequency, high bandwidth devices, e.g., 5G and mmWave systems, and SiPh systems, are being developed to accommodate the ever growing need for high data rate communication systems. For example, the market demand for 5G devices is expected to rise steeply in the coming decade, which will require increased research attention to test the 5G devices. In wireless communication systems, signals are time varying and multi-path propagation requires the phased array, to correct for the beam direction dynamically (beam steering). This requires complex signal processing to implement real time antenna weight (phase shifting) corrections. This also requires an accurate method to measure the phase shift through each antenna element, phase shifters and allow tuning of this phase in real time. Further, the process variation causes the phase through each antenna element and phase shifter to vary. Also, multiple phased arrays can be multiplexed to achieve higher device gain and to lower the bit error rates, which requires calibrating the different phased array elements during production testing to its Gaussian mean distribution.

Advantageously, the testing device and techniques of testing provided herein enable measurement of the absolute phase shift through a device under test. This will enable antenna element phase calibrations and phase shifter corrections to compensate for thermal and process variations on phase. For example, in implementation, an intermediate frequency (IF) signal source is up-converted to an RF signal using a signal from a local oscillator (LO). The up-converted RF signal is then fed to a DUT. A response from the DUT is down-converted to an IF signal using the same signal from the local oscillator. FFT is performed on the filtered IF signal using a synchronized digitizer to measure signal phase. A bypass path is provided for the signal source to be fed back to the down-converter to measure the phase of the input signal source. The DUT interface including any boards and probes are de-embedded using their transmission losses and insertion Phase (S21 phase). Common hardware including RF paths and cables connecting to the DUT interface will have fixed losses and phase offsets applied as a function of frequency to be de-embedded.

FIG. 1 shows a testing (measurement) device in a bypass mode in accordance with aspects of the present disclosure. In particular, the testing device 10 includes an input 12. In embodiments, the input 12 is, for example, a variable low signal IF source that provides a low frequency signal, e.g., 200 MHZ. It should be understood by those of skill in the art that the variable low signal IF source 12 can be at different IF signals depending on the frequency of the device under test (DUT) 14.

In embodiments, the frequency of the variable low signal IF source 12 is fed into an up-converter 18 which is mixed with a high frequency signal received from a high frequency signal source 16 (e.g., local oscillator). The high frequency signal is split by a splitter 17 to an up-converter (e.g., mixer) 18 and down-converter (e.g., mixer) 22 to eliminate the impact of the phase noise to the accuracy of the phase measurement. More specifically, using the signal received from the high frequency signal source 16, the up-converter 18 will up-convert the signal from the variable low signal IF source 12 to an RF signal. That is, the signals from the variable low signal IF source 12 and the high frequency signal source 16 are combined in the up-converter 18 in order to up-convert the signal from the variable low signal IF source 12 to a higher frequency, e.g., frequency of the DUT 14.

In embodiments, for example, the high frequency signal source 16 can be shared as a local oscillator (e.g., high frequency signal source), which provides the high-frequency signal (e.g., of about 38.8 GHz) to the up-converter 18 (and a down-converter 22). In further embodiments, the up-converter 18 and down-converter 22 can be simple mixers (e.g., single ended or differential) or complex blocks having many elements such as filters, amplifiers, attenuators, etc. In one example, identical mixers 18, 22 are used as up and down converters to increase/decrease the frequency of RF signals.

Still referring to FIG. 1, both the variable low signal IF source 12 and the high frequency signal source 16 include a reference signal, e.g., 10 MHZ, in order to synchronize the signal sources and the testing device 10 to reduce phase errors. In embodiments, the reference signal can be generated by a reference signal generator producing a reference signal, which can be any frequency, for example 0.001-1000 MHz (and can be 10 MHz in one implementation).

In the bypass mode of FIG. 1, the up-converted signal is fed through a bypass path 20, directly to the down-converter (e.g., mixer) 22. That is, the up-converted RF signal will bypass the test fixture (test interface) 24 and DUT 16, by opening switches 26a, 26b. The RF signal from the bypass path 20 can be down-converted to an IF signal by combining the RF signal with the signal from the high frequency signal source 16, in the down-converter 22. The down-converted signal will be at the same frequency (e.g., IF signal) as the initial input frequency, e.g., 200 MHz. The down-converted IF signal will then be fed into a digitizer 28. In optional embodiments, a bandpass filter 27 can be placed between the down-converter 22 and the digitizer 28. As should be understood, the band-pass filter 27 will pass frequencies within a certain range to the digitizer and reject (attenuates) frequencies outside that range.

It should thus be recognized by those of skill in the art that the signal from the high frequency signal source (e.g., local oscillator) 16 is used to increase the frequency of an input IF signal (when supplied to an input port of the mixer 18) to an output RF signal, and the signal is similarly used to decrease the frequency of an input RF signal (when supplied to an input port of the down-converter 22) to an output IF signal. The amount of increase/decrease in frequency is dependent upon the high frequency signal, which allows the mixers 18, 22 to generate very small differences between RF and IF frequencies (e.g., a few percent) or generate very large differences (e.g., thousands of times higher/lower frequencies), again based upon the signal from the high frequency signal source 16.

The digitizer 28 can be a synchronized digitizer that converts the IF signal to a digital output signal. In embodiments, the digitizer 28 can include a field-programmable gate array (FPGA), a separate processor, or other logic device which captures the filtered signal and performs FFT to compute the signal phase. The reference signal (e.g., supplied by a reference signal generator) is fed through the high frequency signal source 16 to the mixer 22. Sharing the signal from the local oscillator 16 between the up-converter (e.g., mixer) 18 and the down-converter (e.g., mixer) 22 will also eliminate phase errors by canceling out the phase noise effect between different devices, and to further increase accuracy.

Figure 2:
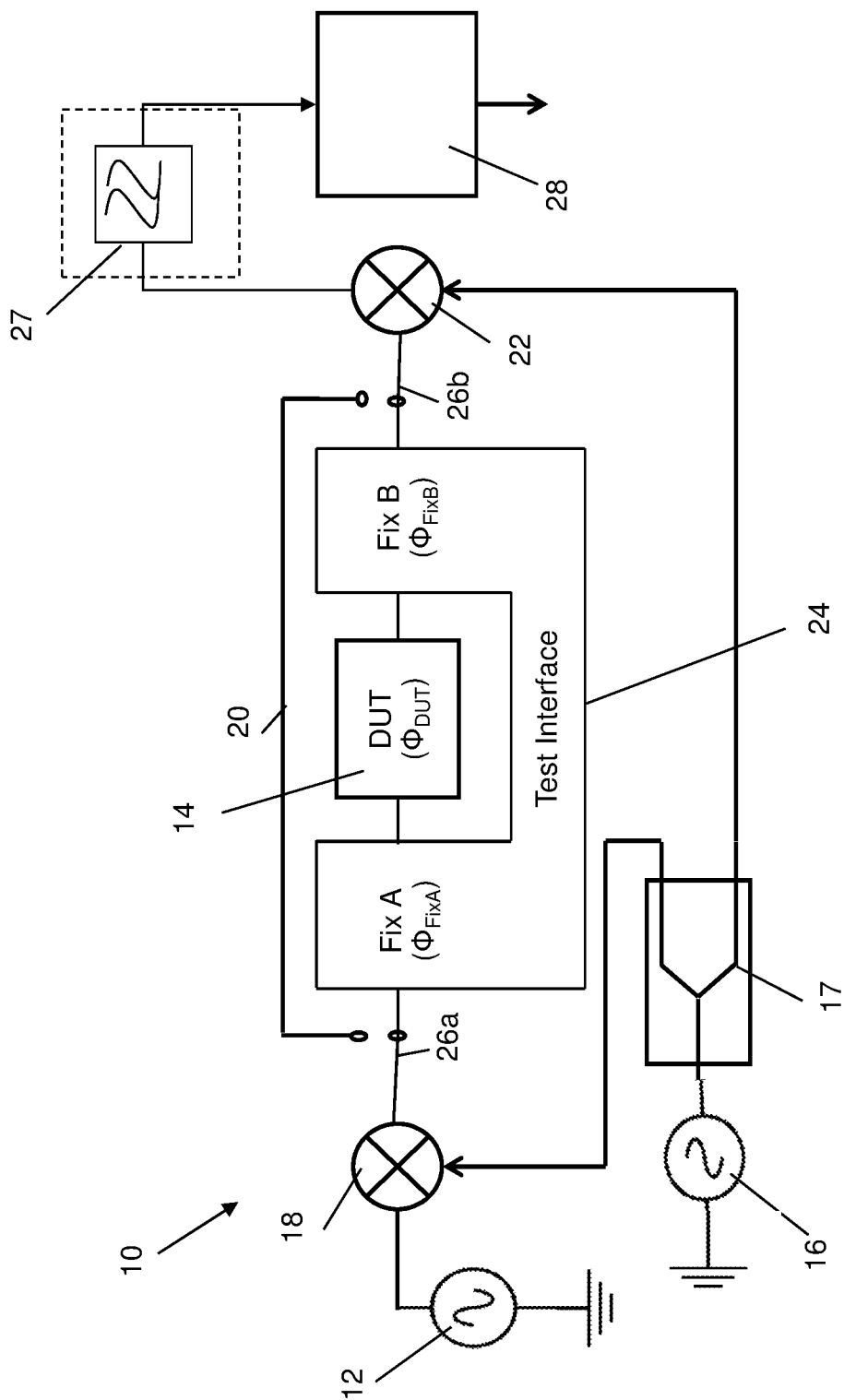
FIG. 2 shows the testing (measurement) device of FIG. 1 in a testing mode in accordance with aspects of the present disclosure.

In further embodiments, the digitizer 28 will receive signals whether in the bypass mode (FIG. 1) or the testing mode (FIG. 2). In this way, it is possible to keep the reference phase of the source when changing to the testing mode (as shown in FIG. 2). Accordingly, the starting phase will not be lost and it will thus be possible to capture the device under test (in the testing mode) in synchrony with the previous measurements. Accordingly, in this sequence, the RF signal from the local oscillator 16 is shared between the up-converter (e.g., mixer) 18 and down-converter (e.g., mixer) 22. The digitizer 28 will capture the output signals with no stop to preserve the phase coherence between the bypass path and device under test (DUT) paths.

FIG. 2 shows the testing (measurement) device in a testing mode in accordance with aspects of the present disclosure. In this mode, the switches 26a, 26b are closed, which directs the up-converted RF signal into the test fixture (test interface) 24 and DUT 14. In this testing mode, the output RF signal exiting the test fixture (test interface) 24 will be down-converted to an IF signal in the down-converter (e.g., mixer) 22 by combining the RF signal output from the test fixture 24 with the RF signal from the high frequency signal source 16. In optional embodiments, the down-converted signal can pass through a narrow bandpass filter 27 to pick the necessary frequency and eliminate any signal outside the desired bandwidth of the filter. The down-converted signal will then be fed into a digitizer 28, which will perform FFT to compute the output signal phase of the DUT 14.

As should be understood by those of skill in the art, the digitizer 28 continuously receives the output frequency signal from the down-converter (e.g., mixer) 22 during the full (all of the) testing cycle (and during the bypass mode). In embodiments, the digitizer 28 also keeps track of the phase change in the output signal from the down-converter (e.g., mixer) 22 as the DUT 14 is operated during a testing cycle. In embodiments, the full testing cycle can supply different test signals to the DUT 14, and the DUT 14 can be programmed to different phase offsets, the DUT 14 can also be programmed to operate using different ports, etc. Note that operating the DUT 14 at different phase offsets or to use different ports is sometimes referred to as "different phase/port steps of the testing cycle".

In embodiments, prior to set-up, S-parameter will be calculated one time for the text fixture 24 and stubs, e.g., switches 26a, 26b and cable between them. The test solution provided herein will measure the phase accurately without the need for full 2-port S-Parameter measurement as employed in current PNAs. In addition, using the techniques provided herein, the S-parameters will not need to be transformed into T-parameters; that is, the techniques described herein circumvents the need to perform complex mathematical processing such as the done by a PNA, i.e., transforming S-parameter data into T-parameters and performing complex math to remove measurement system fixtures to determine the final measured phase as described in equations (F1-F3).

$$[T_{DUT}^1] = [T_{FixA}]^{-1}[T_{Meas\_ref}][T_{FixB}]^{-1} \quad (F1)$$

$$[T_{Fix}]^{-1} \equiv \begin{bmatrix} T_{22} & -T_{12} \\ -T_{21} & T_{11} \end{bmatrix} \equiv \begin{bmatrix} 0 & -T_{12} \\ -T_{21} & 0 \end{bmatrix} \quad (F2)$$

$$S_{21\_DUT} = \frac{S_{21\_Meas\_ref}}{S_{21\_FixA} S_{21\_FixB}} \quad (F3)$$

Instead, the absolute phase of the DUT 14 can be computed by removing the phase due to the source, fixtures, and measurement equipment with equation F4 only:

$$\varphi_{dut} = \varphi_{bypass\_mode} - \varphi_{DUT\_mode} - \varphi_{FixA} - \varphi_{FixB} - \varphi_{bypass\_cable} \quad (F4)$$

where: $\varphi_{dut}$ the phase of the device under test calculated by equation F4; $\varphi_{bypass\_mode}$ the phase measured by digitizer when bypass mode is selected; $\varphi_{DUT-mode}$ the phase measured by the digitizer when the DUT path is selected; $\varphi_{FixA}$ the phase of Fixture A, measured one time during initial calibration; $\varphi_{FixB}$ the phase of Fixture B, measured one time during initial calibration; and $\varphi_{bypass\_cable}$ the phase of the RF cable 20 used to make the bypass mode, measured one time during initial calibration.

In this way, the signal which was processed in the testing mode of FIG. 2 can be subtracted by the signal which was processed in the bypass mode of FIG. 1 to obtain an absolute phase of the DUT 14. In addition, by synchronizing the phase of the signals, phase errors are minimized, if not completely eliminated.

Figure 3:
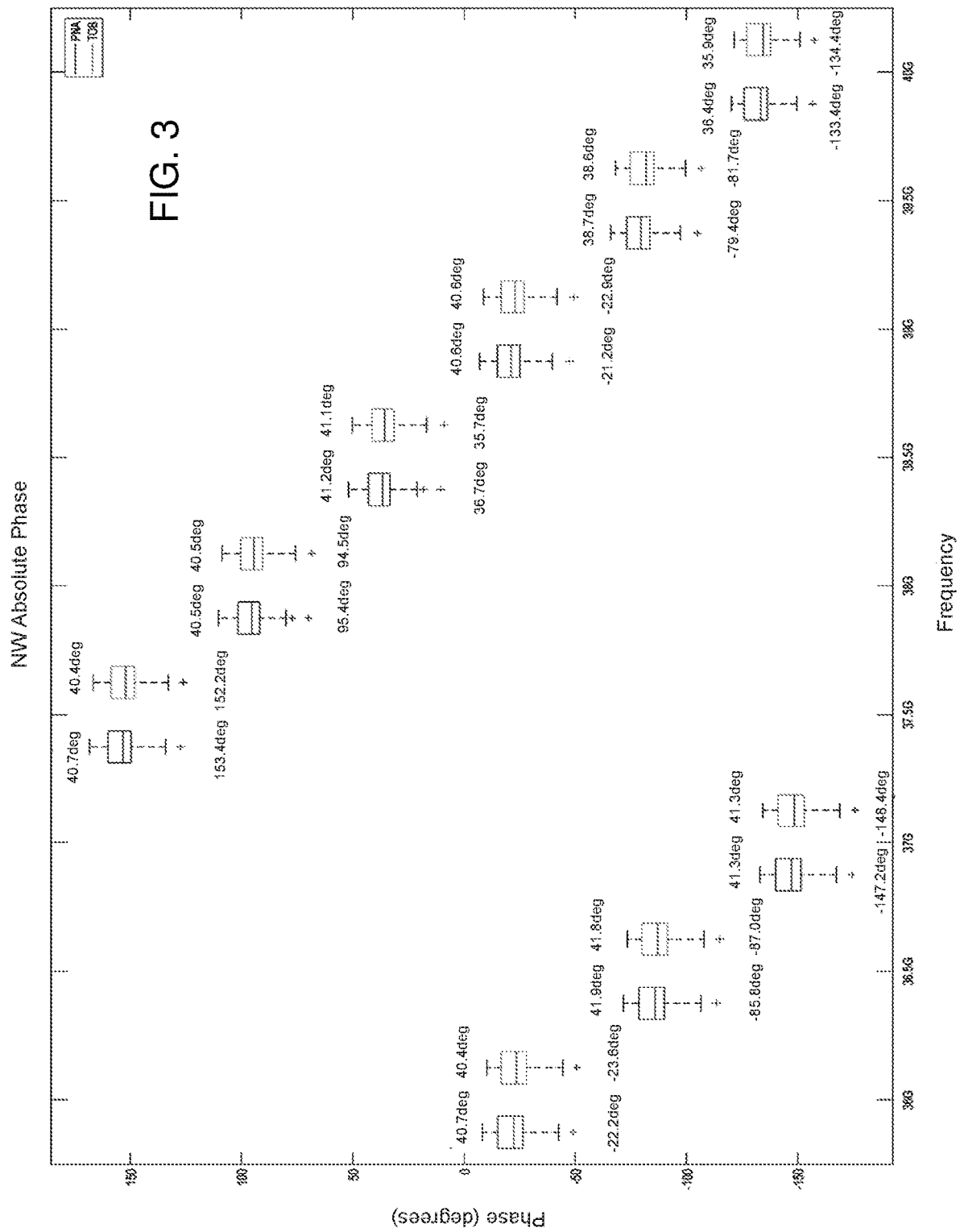
FIG. 3 shows a plot of an absolute phase using the testing equipment and techniques described herein versus frequency using a conventional PNAx.

FIG. 3 shows a plot of an absolute phase measured using the testing equipment and techniques described herein and a conventional PNAx, versus frequency. More specifically, the plot of FIG. 3 shows a 25 part sample randomly distributed across a wafer tested by using the PNAx and the testing equipment and techniques described herein. In this plot, the bottom x-axis is frequency and the y-axis is phase, in degrees. In each pair of boxes, the leftmost box represents the phase measured using the PNAx and the rightmost box represents the phase measured using the testing equipment and techniques described herein. The value on top of the box represents the range of phase (maximum value-minimum value) for the 25 measured devices. The value at the bottom of the box represents the median value for the 25 measured devices.

Figure 4:
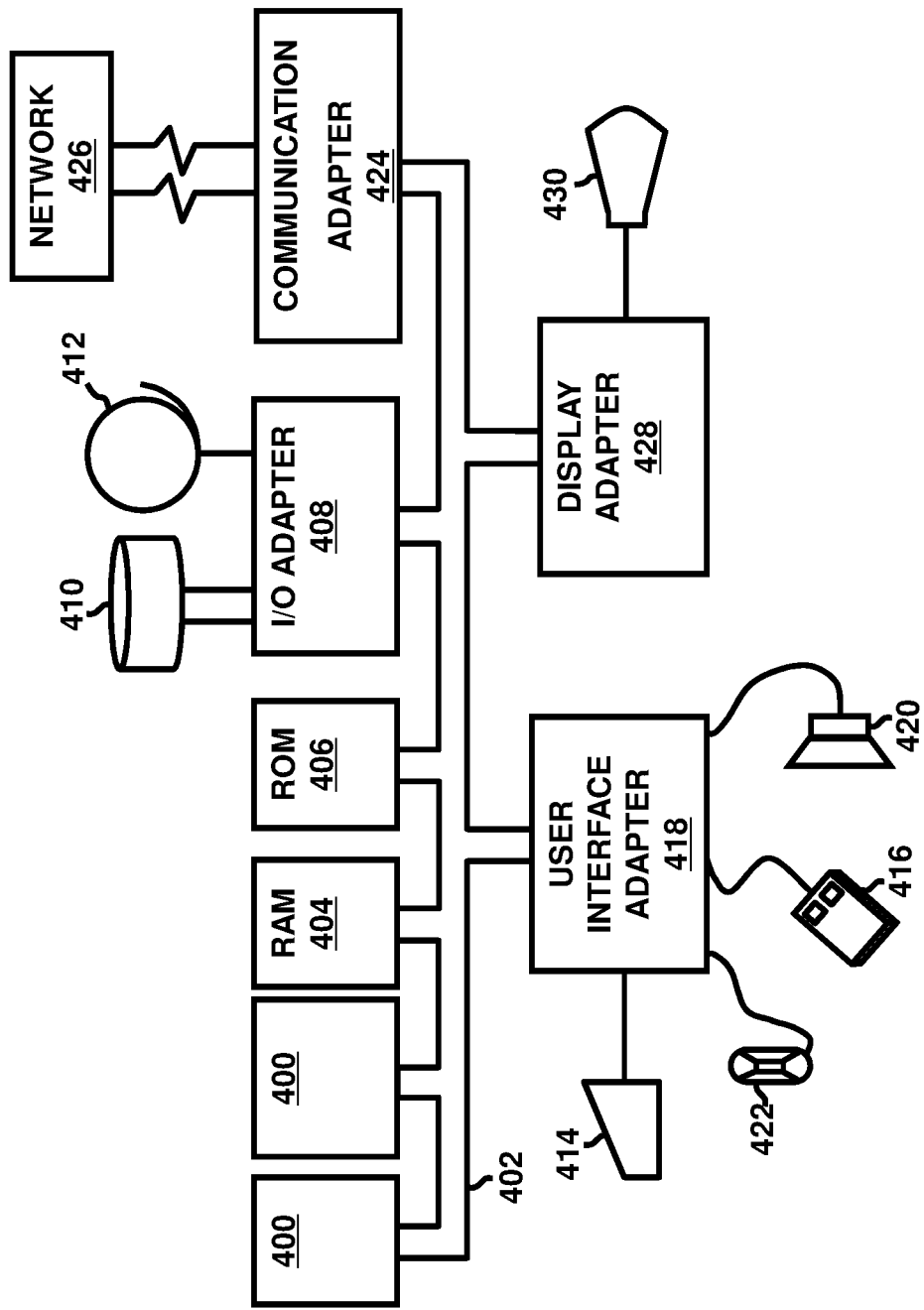
FIG. 4 shows a schematic drawing illustrating a hardware configuration that can perform any of the logic or control functions described in the present disclosure.

FIG. 4 presents a schematic drawing illustrates a hardware configuration that can perform any of the logic or control functions described above. The system incorporates at least one processor or central processing unit (CPU) 400. The CPUs 400 are interconnected via a system bus 402 to various devices such as a random access memory (RAM) 404, read-only memory (ROM) 406, and an input/output (I/O) adapter 408. The I/O adapter 408 can connect to peripheral devices, such as disk units 410 and tape drives 412, or other program storage devices that are readable by the system. The system can read the instructions on the program storage devices and follow these instructions to execute the methodology of the embodiments herein. The system further includes a user interface adapter 418 that connects a keyboard 414, mouse 416, speaker 420, microphone 422, and/or other user interface devices such as a touch screen device (not shown) to the bus 402 to gather user input. Additionally, a communication adapter 424 connects the bus 402 to a data processing network 426, and a display adapter 428 connects the bus 402 to a display device 430 which may be embodied as an output device such as a monitor, printer, or transmitter, for example.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
a first frequency input source which provides a first signal to an up-converter at an input side of a test fixture;
a down-converter on an output side of the test fixture;
a second frequency signal source which is split to provide a second signal at a higher frequency than the first signal to the up-converter and the down-converter;
a bypass path which bypasses the test fixture and provides connection between the up-converter and the down-converter;
a digitizer that is connected to an output side of the down-converter; and
switches provided at the input side and the output side of the test fixture, the switch located at the input side switches between providing the combined first signal and the second signal to the bypass path or the test fixture, and the switch located at the output side provides a signal from the test fixture to the down-converter.

2. The structure of claim 1, wherein:
the up-converter up converts the first frequency signal to an RF signal by combining it with the second signal; and
the down-converter down converts the converted RF signal to an IF frequency signal by combining the RF signal with the second signal received from the second frequency signal source.

3. The structure of claim 2, wherein the second frequency signal source is a local oscillator which provides the second signal to a splitter, the second signal is a high frequency signal which the splitter splits to feed into both the up-converter and down-converter at a same time.

4. The structure of claim 3, wherein both the up-converter and down-converter are mixers.

5. The structure of claim 1, wherein the digitizer is structured to perform an absolute phase measurement of a device under test.

6. The structure of claim 1, further comprising a reference signal that is provided to both the up-converter and the down-converter.

7. The structure of claim 6, wherein the reference signal synchronizes the signal sources and the test fixture to reduce phase errors.

8. The structure of claim 7, wherein the digitizer is a synchronized digitizer.

9. The structure of claim 8, wherein the synchronized digitizer is structured to calculate an absolute phase measurement by comparing a signal that passes through the bypass path and a signal that passes through the test fixture, the synchronized digitizer is further configured to keep track of a bypass phase and device under test (DUT) phase by keeping a same starting reference phase.

10. The structure of claim 1, wherein the first signal is up-converted using a signal from a signal of the second frequency signal source and fed to a device under test and a response from device under test is down-converted using a same second frequency signal source, the second frequency signal source being a local oscillator.

11. The structure of claim 10, wherein the up-converted signal is fed back to the down-converter to measure a signal phase of the signal source.

12. A structure comprising:
an intermediate frequency (IF) source;
an RF frequency source;
a first mixer at an input of a device under test and which up-converts a signal from the IF frequency source;
a second mixer at an output of the device under test and which down-converts a signal received from the device under test or the up-converted signal;
a bypass path which bypasses the device under test and provides connection between the first mixer and the second mixer; and
a splitter which splits a signal from the RF source to the first mixer and the second mixer wherein:
the first mixer is an up-converter that up converts a low frequency signal from the IF frequency source to a higher frequency signal using the RF frequency source; and
the down-converter down converts the converted RF signal to an IF frequency signal and further comprising:
switches provided at the input side and the output side of the test fixture, wherein:
the switch located at the input side switches between providing the up-converted signal to the bypass path or the device under test,
the switch located at the output side provides a signal from the device under test to the down-converter, and
when the switch closes a signal path between the up-converter and the device under test, the up-converted signal is fed directly to the device under test and the down-converter down converts a signal received from the device under test.

13. The structure of claim 12, further comprising a digitizer that calculates an absolute phase measurement by comparing a signal that passes through the bypass path and a signal that passes through the test fixture, wherein the digitizer continues running to keep phase difference measured accurate between a bypass path and a device under test (DUT) path.

14. The structure of claim 13, further comprising a reference signal that is provided to both the up-converter and the down-converter.

15. The structure of claim 12, wherein a device under test fixture, signal paths and switches are de-embedded using their transmission losses (S21 phase).

16. A method comprising:
up-converting a source signal using a first signal;
bypassing a device under test with the up-converted source signal;
down-converting the source signal using the first signal;
providing the up-converted source signal to the device under test;
down-converting a signal received from the device under test; and
determining an absolute phase of the device under test by subtracting the down-converted signal of the device under test from the down-converted signal of the bypassing.

17. The method of claim 16, further comprising de-embedding a device under test fixture, signal paths and switches of a test device using their transmission losses (S21 phase).

* * * * *

UNITED STATES PATENT AND TRADEMARK OFFICE
CERTIFICATE OF CORRECTION

PATENT NO. : 10,949,005 B2  
APPLICATION NO. : 16/429702  
DATED : March 16, 2021  
INVENTOR(S) : Mustapha Slamani et al.

Page 1 of 1

It is certified that error appears in the above-identified patent and that said Letters Patent is hereby corrected as shown below:

In the Claims

In Claim 12, Line 13 at Column 8, add "," after "second mixer".

Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*